US009673808B1

(12) United States Patent
Tang et al.

(10) Patent No.: US 9,673,808 B1
(45) Date of Patent: Jun. 6, 2017

(54) POWER ON-RESET CIRCUIT

(71) Applicant: Faraday Technology Corp., Hsinchu (TW)

(72) Inventors: Kai-Neng Tang, Hsinchu (TW); Chi-Sheng Liao, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 15/065,879

(22) Filed: Mar. 10, 2016

(30) Foreign Application Priority Data

Jan. 12, 2016 (TW) .............................. 105100757 A

(51) Int. Cl.
*H03K 5/22* (2006.01)
*H03K 17/22* (2006.01)

(52) U.S. Cl.
CPC ................................. *H03K 17/223* (2013.01)

(58) Field of Classification Search
None
See application file for complete search history.

(56) References Cited

U.S. PATENT DOCUMENTS

| 3,984,703 | A | * | 10/1976 | Jorgensen | ............ | H03K 3/3565 |
| | | | | | | 327/206 |
| 5,550,493 | A | * | 8/1996 | Miyanishi | ............ | H03K 5/2481 |
| | | | | | | 327/307 |
| 7,046,055 | B2 | * | 5/2006 | Lee | ...................... | H03K 17/223 |
| | | | | | | 327/143 |
| 2004/0080305 | A1 | * | 4/2004 | Lin | ..................... | H01L 27/0629 |
| | | | | | | 323/312 |
| 2015/0042386 | A1 | * | 2/2015 | Bhowmik | ............ | H03K 17/223 |
| | | | | | | 327/143 |

FOREIGN PATENT DOCUMENTS

| TW | 201144971 A | 12/2011 |
| TW | 201217947 A | 5/2012 |
| TW | 201349742 A | 12/2013 |
| TW | 201406032 A | 2/2014 |
| TW | 201409216 A | 3/2014 |
| TW | 201417496 A | 5/2014 |
| TW | 201510706 A | 3/2015 |

* cited by examiner

*Primary Examiner* — Long Nguyen
(74) *Attorney, Agent, or Firm* — Winston Hsu

(57) ABSTRACT

A power-on-reset circuit including a first diode-connected transistor, a second diode-connected transistor, a resistor and a current comparator circuit is provided. A cathode of the first diode-connected transistor is coupled to a reference voltage. A first end of the resistor is coupled to a power voltage. A second end of the resistor is coupled to an anode of the first diode-connected transistor. A cathode of the second diode-connected transistor is coupled to the reference voltage. An anode of the second diode-connected transistor is coupled to the first end of the resistor. The current comparator circuit is coupled to the first diode-connected transistor and the second diode-connected transistor. The current comparator circuit compares a current of the first diode-connected transistor with a current of the second diode-connected transistor to obtain a comparing result, wherein the comparing result determines a reset signal.

12 Claims, 2 Drawing Sheets

POWER ON-RESET CIRCUIT

CROSS-REFERENCE TO RELATED APPLICATION

This application claims the priority benefit of Taiwan application serial no. 105100757, filed on Jan. 12, 2016. The entirety of the above-mentioned patent application is hereby incorporated by reference herein and made a part of this specification.

BACKGROUND OF THE INVENTION

Field of the Invention

The invention relates to a reset signal generating circuit, and particularly relates to a power-on-reset circuit.

Description of Related Art

In design of an electronic circuit, a reset mechanism is generally added to the electronic circuit, such that the designed electronic circuit can be restored to an initial state when it is in need. Particularly, in the beginning of power-on of the electronic circuit, various components (for example, a register) in a system circuit are in an indeterminate state, and now it is required to reset the system circuit, so as to set each component in the system circuit to the initial state. A power-on-reset circuit may detect a level of a power voltage. During the power-on process, when the power voltage exceeds a voltage detection point $V_{det}$, the power-on-reset circuit may provide a reset signal to reset a state of a logic circuit (the system circuit). However, the level of the voltage detection point $V_{det}$ is generally influenced by temperature, especially in an advanced manufacturing process.

SUMMARY OF THE INVENTION

The invention is directed to a power-on-reset circuit, which is adapted to generate a reset signal in real-time during a power-on process.

An embodiment of the invention provides a power-on-reset circuit, which is adapted to generate a reset signal in the beginning of power-on. The power-on-reset circuit includes a first diode-connected transistor, a second diode-connected transistor, a first resistor and a current comparator circuit. The first diode-connected transistor has an anode and a cathode. The cathode of the first diode-connected transistor is coupled to a reference voltage. A first end of the first resistor is coupled to a power voltage. A second end of the resistor is coupled to the anode of the first diode-connected transistor. The second diode-connected transistor has an anode and a cathode. The cathode of the second diode-connected transistor is coupled to the reference voltage. The anode of the second diode-connected transistor is coupled to the first end of the first resistor. The current comparator circuit is coupled to the first diode-connected transistor and the second diode-connected transistor. The current comparator circuit compares a current of the first diode-connected transistor and a current of the second diode-connected transistor to obtain a comparing result, wherein the comparing result determines the reset signal.

According to the above description, the power-on-reset circuit of the invention may generate the reset signal in the beginning of the power-on process, so as to reset a state of a logic circuit (a system circuit). The power-on-reset circuit of the invention has temperature compensation, so as to narrow a variation range of a voltage detection point under different temperatures.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
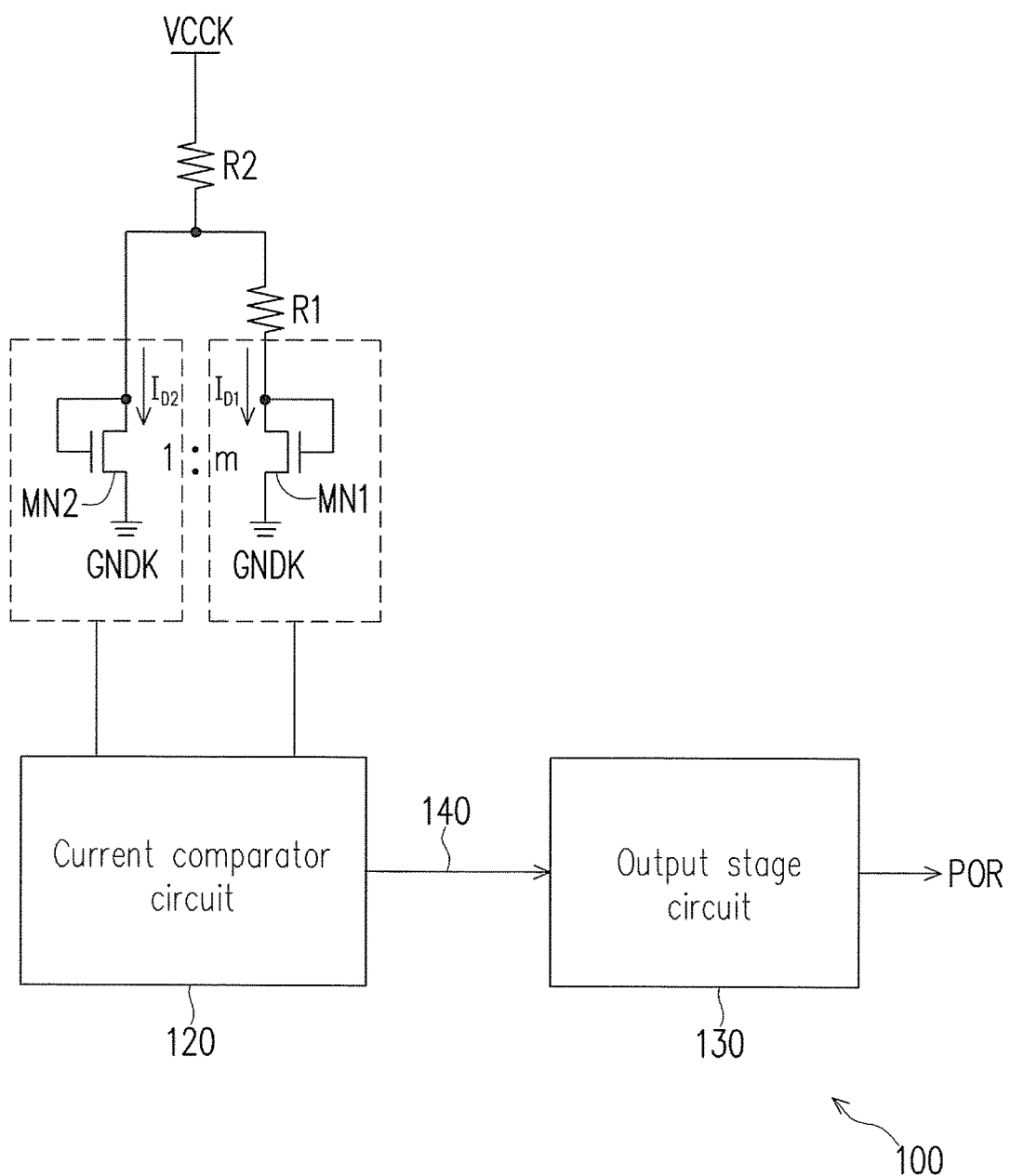
FIG. 1 is a circuit block diagram of a power-on-reset circuit 100 according to an embodiment of the invention.

A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, wherever possible, components/members/steps using the same referential numbers in the drawings and description refer to the same or like parts. Components/members/steps using the same referential numbers or using the same terms in different embodiments may cross-refer related descriptions.

FIG. 1 is a circuit block diagram of a power-on-reset circuit 100 according to an embodiment of the invention. In the beginning of power-on, a power voltage VCCK is boosted from a low voltage to a rated voltage level. In the beginning of power-on, when the power voltage VCCK exceeds a voltage detection point $V_{det}$ (the voltage detection point $V_{det}$ is smaller than the rated voltage), the power-on-reset circuit 100 may generate a reset signal POR to a system circuit (not shown) in real-time, so as to reset a state of the system circuit.

Referring to FIG. 1, the power-on-reset circuit 100 includes a diode-connected transistor MN1, a diode-connected transistor MN2, a resistor R1, a resistor R2 and a current comparator circuit 120. A first end of the resistor R2 is coupled to the power voltage VCCK. A second end of the resistor R2 is coupled to a first end of the resistor R1. The second end of the resistor R2 is coupled to an anode of the diode-connected transistor MN1. A cathode of the diode-connected transistor MN1 is coupled to a reference voltage GNDK (for example, a ground voltage). In the present embodiment, the diode-connected transistor MN1 can be an N-channel metal oxide semiconductor (NMOS) transistor. A first terminal (for example, a source) of the NMOS transistor MN1 serves as the cathode for coupling to the reference voltage GNDK. A control terminal (for example, a gate) of the NMOS transistor MN1 is coupled to a second terminal (for example, a drain) of the NMOS transistor MN1. The second terminal of the NMOS transistor MN1 serves as the anode.

A cathode of the diode-connected transistor MN2 is coupled to the reference voltage GNDK. An anode of the diode-connected transistor MN2 is coupled to the first end of the resistor R1 and the second end of the resistor R2. In the present embodiment, the diode-connected transistor MN2 can be an NMOS transistor. A first terminal (for example, a source) of the NMOS transistor MN2 serves as the cathode for coupling to the reference voltage GNDK. A control terminal (for example, a gate) of the NMOS transistor MN2 is coupled to a second terminal (for example, a drain) of the NMOS transistor MN2. The second terminal of the NMOS transistor MN2 serves as the anode.

A channel width to length ratio W/L (or a channel width W, or a reciprocal of a channel length 1/L) of the diode-connected transistor MN1 is greater than a channel width to length ratio W/L (or a channel width W, or a reciprocal of a channel length 1/L) of the diode-connected transistor MN2. For example, a ratio between the channel width to length ratio W/L of the diode-connected transistor MN2 and the channel width to length ratio W/L of the diode-connected transistor MN1 can be 1:m.

In the beginning (the beginning of the power-on), neither the diode-connected transistor MN1 nor the diode-connected transistor MN2 enters a subthreshold region. When none of the diode-connected transistor MN1 and the diode-connected transistor MN2 enters the subthreshold region, a sum of an equivalent resistance of the diode-connected transistor MN1 and a resistance of the resistor R1 is smaller than an equivalent resistance of the diode-connected transistor MN2. Therefore, in the beginning (the beginning of the power-on), when the power voltage VCCK is boosted, a current $I_{D1}$ of the diode-connected transistor MN1 is greater than a current $I_{D2}$ of the diode-connected transistor MN2 (due to that the equivalent resistance of the diode-connected transistor MN2 is greater than a total resistance of the diode-connected transistor MN1 and the resistor R1).

In the power-on process, along with the gradually boosted power voltage VCCK, the diode-connected transistor MN1 and the diode-connected transistor MN2 enter the subthreshold region. In the subthreshold region, the current $I_{D2}$ is increased in a higher rate (due to that the equivalent resistances of the diode-connected transistor MN1 and the diode-connected transistor MN2 become more and more smaller), and the resistor R1 gradually dominates the equivalent resistance of the "resistor R1 and the diode-connected transistor MN1". Therefore, when the diode-connected transistor MN1 and the diode-connected transistor MN2 enter the subthreshold region, a sum of the equivalent resistance of the diode-connected transistor MN1 and the resistance of the resistor R1 is greater than the equivalent resistance of the diode-connected transistor MN2, such that the current $I_{D1}$ of the diode-connected transistor MN1 is smaller than the current $I_{D2}$ of the diode-connected transistor MN2.

The current comparator circuit 120 is coupled to the diode-connected transistor MN1 and the diode-connected transistor MN2. The current comparator circuit 120 may compare the current $I_{D1}$ of the diode-connected transistor MN1 and the current $I_{D2}$ of the diode-connected transistor MN2 to obtain a comparing result 140. The reset signal POR output by the power-on-reset circuit 100 is determined by the comparing result 140 of the current comparator circuit 120. When the current $I_{D1}$ is equal to the current $I_{D2}$, it represents that the power voltage VCCK has been boosted to the voltage detection point $V_{det}$. When the current $I_{D1}$ is equal to (or smaller than) the current $I_{D2}$, the current comparator circuit 120 sends a high signal to a next stage circuit.

When the current $I_{D1}$ is equal to the current $I_{D2}$, it represents that the power voltage VCCK has been boosted to the voltage detection point $V_{det}$. When the current $I_{D1}$ is equal to the current $I_{D2}$, the current $I_{D1}=\Delta V_{GS}/R_1$, where $\Delta V_{GS}$ represents a difference between a gate source voltage $V_{GS1}$ of the diode-connected transistor MN1 and a gate source voltage $V_{GS2}$ of the diode-connected transistor MN2 (for example, $\Delta V_{GS}=V_{GS2}-V_{GS1}$), and $R_1$ represents a resistance value of the resistor R1. When the current $I_{D1}$ is equal to the current $I_{D2}$, the voltage detection point $V_{det}=V_{GS2}+(I_{D1}+I_{D2})R_2=V_{GS2}+(2R_2/R_1)\Delta V_{GS}=V_{OV2}+V_{TH}+(2R_2/R_1)\Delta V_{OV}$, where R2 represents a resistance value of the resistor R2, $$V_{OV2} = \zeta V_T \left[\ln(I_{D2}) - \ln\left(\mu_n C_d \frac{W}{L} V_T^2\right)\right] = \zeta V_T [\ln(I_{D2}) - \ln(A\mu_n V_T^2)],$$

$$\zeta \equiv 1 + \frac{C_d}{C_{OX}}, V_T$$

represents a thermal voltage $$\left(V_T \equiv \frac{KT}{q}\right),$$

$$A \propto \frac{W}{L},$$

$V_{TH}$ represents a threshold voltage of the NMOS transistor, $$\Delta V_{OV} = \zeta V_T \left[\ln \frac{mI_{D1}}{I_{D2}}\right].$$

The current (for example the current $I_{D1}$, the current $I_{D2}$) of the NMOS transistor in the subthreshold region includes the thermal voltage $V_T$. The thermal voltage $V_T$ is a positive temperature coefficient, so that $\Delta V_{OV}$ is a positive temperature coefficient. The threshold voltage $V_{TH}$ of the NMOS transistor is a negative temperature coefficient. When the current $I_{D1}$ is equal to the current $I_{D2}$, the voltage detection point $V_{det}=V_{OV2}+V_{TH}+(2R_2/R_1)\Delta V_{OV}$, so that the power-on-reset circuit 100 of the invention has temperature compensation. The power-on-reset circuit 100 having temperature compensation may narrow a variation range of the voltage detection point $V_{det}$ under different temperatures. The power-on-reset circuit 100 of the present embodiment may implement the accurate voltage detection point $V_{det}$ in a low-power low-voltage field.

In the present embodiment, the power-on-reset circuit 100 further includes an output stage circuit 130. The output stage circuit 130 is coupled to the current comparator circuit 120 for receiving the comparing result 140. The output stage circuit 130 may correspondingly generate the reset signal POR according to the comparison result 140. In some embodiments, the output stage circuit 130 may include a Schmitt-trigger buffer. An input terminal of the Schmitt-trigger buffer is coupled to the current comparator circuit 120 for receiving the comparing result 140. An output terminal of the Schmitt-trigger buffer provides the reset signal POR. The Schmitt-trigger buffer may prevent a noise of the comparing result 140, and enhance maneuverability of the power-on-reset circuit 100. Finally, when the power voltage VCCK is pulled up to be higher than the voltage detection point $V_{det}$, the reset signal POR of the power-on-reset circuit 100 is pulled up high.

Figure 2:
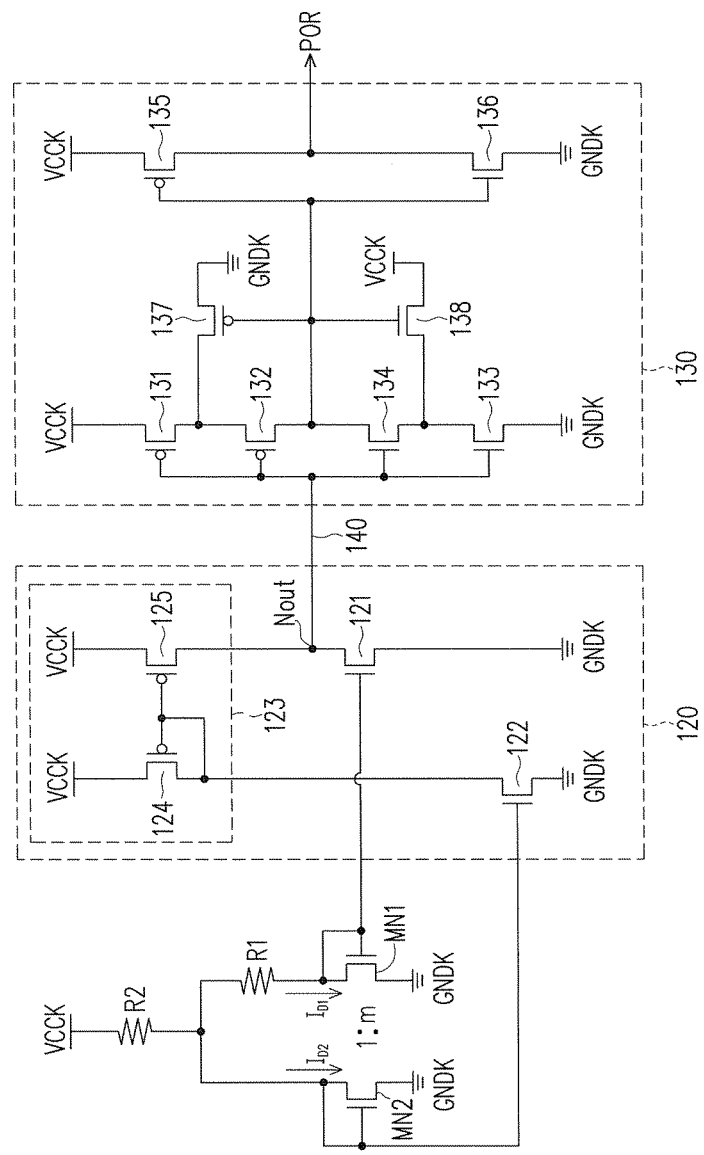
FIG. 2 is a circuit schematic diagram of a current comparator circuit and an output stage circuit of FIG. 1 according to an embodiment of the invention.

FIG. 2 is a circuit schematic diagram of the current comparator circuit 120 and the output stage circuit 130 of FIG. 1 according to an embodiment of the invention. In the embodiment of FIG. 2, the current comparator circuit 120 includes a transistor 121, a transistor 122 and a current mirror 123. In the present embodiment, the transistor 121 and the transistor 122 can be NMOS transistors. A control terminal (for example, a gate) of the transistor 121 is coupled to the gate of the diode-connected transistor MN1. A first terminal (for example, a source) of the transistor 121 is coupled to the reference voltage GNDK. A second terminal (for example, a drain) of the transistor 121 is coupled to an output node Nout of the current comparator circuit 120. A control terminal (for example, a gate) of the transistor 122 is coupled to the gate of the diode-connected transistor MN2. A first terminal (for example, a source) of the transistor 122 is coupled to the reference voltage GNDK. The current mirror 123 has a master current terminal and a slave current terminal. The master current terminal of the current mirror 123 is coupled to a second terminal (for example, a drain) of the transistor 122. The slave current terminal of the current mirror 123 is coupled to the output node Nout. The output node Nout may provide the comparing result 140 to the input terminal of the output stage circuit 130.

In the embodiment of FIG. 2, the current mirror 123 includes a transistor 124 and a transistor 125. In the present embodiment, the transistor 124 and the transistor 125 can be P-channel metal oxide semiconductor (PMOS) transistors. A first terminal (for example, a source) of the transistor 124 is coupled to the power voltage VCCK. A second terminal (for example, a drain) of the transistor 124 is coupled to the master current terminal of the current mirror 123 (i.e. coupled to the second terminal of the transistor 122). A control terminal (for example, a gate) of the transistor 124 is coupled to the second terminal of the transistor 124. A first terminal (for example, a source) of the transistor 122 is coupled to the power voltage VCCK. A second terminal (for example, a drain) of the transistor 125 is coupled to the slave current terminal of the current mirror 123 (i.e. coupled to the output node Nout). A control terminal (for example, a gate) of the transistor 125 is coupled to the control terminal of the transistor 124.

In the embodiment of FIG. 2, the output stage circuit 130 includes a transistor 131, a transistor 132, a transistor 133, a transistor 134, a transistor 135 and a transistor 136. In the present embodiment, the transistors 131, 132 and 135 can be PMOS transistors, and the transistors 133, 134 and 136 can be NMOS transistors. A first terminal (for example, a source) of the transistor 131 is coupled to the power voltage VCCK. A control terminal (for example, a gate) of the transistor 131 is coupled to the current comparator circuit 120 for receiving the comparing result 140. A first terminal (for example, a source) of the transistor 132 is coupled to a second terminal (for example, a drain) of the transistor 131. A control terminal (for example, a gate) of the transistor 132 is coupled to the current comparator circuit 120 for receiving the comparing result 140. A first terminal (for example, a source) of the transistor 133 is coupled to a reference voltage GNDK. A control terminal (for example, a gate) of the transistor 133 is coupled to the current comparator circuit 120 for receiving the comparing result 140. A first terminal (for example, a source) of the transistor 134 is coupled to a second terminal (for example, a drain) of the transistor 133. A second terminal (for example, a drain) of the transistor 134 is coupled to a second terminal (for example, a drain) of the transistor 132. A control terminal (for example, a gate) of the transistor 134 is coupled to the current comparator circuit 120 for receiving the comparing result 140. A control terminal (for example, a gate) of the transistor 135 is coupled to the second terminal of the transistor 132 and the second terminal of the transistor 134. A first terminal (for example, a source) of the transistor 135 is coupled to the power voltage VCCK. A second terminal (for example, a drain) of the transistor 135 is coupled to the output terminal of the output stage circuit 130 for providing the reset signal POR. A control terminal (for example, a gate) of the transistor 136 is coupled to the control terminal of the transistor 135. A first terminal (for example, a source) of the transistor 136 is coupled to the reference voltage GNDK. A second terminal (for example, a drain) of the transistor 136 is coupled to the second terminal of the transistor 135.

According to a design requirement, the output stage circuit 130 may further include a transistor 137 and a transistor 138. In the present embodiment, the transistor 137 can be a PMOS transistor, and the transistor 138 can be an NMOS transistor. A first terminal (for example, a source) of the transistor 137 is coupled to the second terminal of the transistor 131. A second terminal (for example, a drain) of the transistor 137 is coupled to the reference voltage GNDK. A control terminal (for example, a gate) of the transistor 137 is coupled to the second terminal of the transistor 132. A first terminal (for example, a source) of the transistor 138 is coupled to the second terminal of the transistor 133. A second terminal (for example, a drain) of the transistor 138 is coupled to the power voltage VCCK. A control terminal (for example, a gate) of the transistor 138 is coupled to the second terminal of the transistor 134.

It should be noted that in different applications, related functions of the power-on-reset circuit 100, the diode-connected transistor MN1, the diode-connected transistor MN2, the resistor R1, the resistor R2, the current comparator circuit 120 and/or the output stage circuit 130 can be implemented as firmware or hardware by using general programming languages, hardware description languages (for example, Verilog HDL or VHDL) or other suitable programming languages. The firmware capable of executing the related functions can be implemented as any computer-accessible media, for example, a magnetic tape, a semiconductor memory, a magnetic disk or a compact disk (for example, CD-ROM or DVD-ROM), or can be transmitted through the Internet, wired communication, wireless communication or other communication media. The firmware can be stored in computer-accessible media to facilitate a processor of a computer to access/execute programming codes of the firmware. Moreover, the device and method of the invention can be implemented through a combination of hardware and software.

In summary, when the current $I_{D1}$ is equal to the current $I_{D2}$, the voltage detection point $V_{det}=V_{OV2}+V_{TH}+(2R_2/R_1)\Delta V_{OV}$. $\Delta V_{OV}$ is a positive temperature coefficient, and $V_{TH}$ is a negative temperature coefficient. Therefore, the power-on-reset circuit 100 of the embodiments of the invention has temperature compensation. The power-on-reset circuit 100 having temperature compensation may narrow a variation range of the voltage detection point $V_{det}$ under different temperatures. The power-on-reset circuit 100 of the present embodiment may implement the accurate voltage detection point $V_{det}$ in a low-power low-voltage field.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A power-on-reset circuit, adapted to generate a reset signal in the beginning of power-on, the power-on-reset circuit comprising:
   a first diode-connected transistor, having an anode and a cathode, wherein the cathode of the first diode-connected transistor is coupled to a reference voltage;
   a first resistor, having a first end and a second end, wherein the first end of the first resistor is coupled to a power voltage, and the second end of the first resistor is directly coupled to the anode of the first diode-connected transistor;
   a second diode-connected transistor, having an anode and a cathode, wherein the cathode of the second diode-connected transistor is coupled to the reference voltage, and the anode of the second diode-connected transistor is directly coupled to the first end of the first resistor; and
   a current comparator circuit, coupled to the first diode-connected transistor and the second diode-connected transistor, and comparing a current of the first diode-connected transistor and a current of the second diode-connected transistor to obtain a comparing result, wherein the comparing result determines the reset signal.

2. The power-on-reset circuit as claimed in claim 1, wherein the first diode-connected transistor and the second diode-connected transistor are N-channel metal oxide semiconductor transistors.

3. The power-on-reset circuit as claimed in claim 1, wherein a channel width to length ratio of the first diode-connected transistor is greater than a channel width to length ratio of the second diode-connected transistor.

4. The power-on-reset circuit as claimed in claim 1, wherein when the first diode-connected transistor and the second diode-connected transistor do not enter the subthreshold region, a sum of an equivalent resistance of the first diode-connected transistor and a resistance of the first resistor is smaller than an equivalent resistance of the second diode-connected transistor, such that the current of the first diode-connected transistor is greater than the current of the second diode-connected transistor.

5. The power-on-reset circuit as claimed in claim 1, wherein when the first diode-connected transistor and the second diode-connected transistor enter the subthreshold region, a sum of an equivalent resistance of the first diode-connected transistor and a resistance of the first resistor is greater than an equivalent resistance of the second diode-connected transistor, such that the current of the first diode-connected transistor is smaller than the current of the second diode-connected transistor.

6. The power-on-reset circuit as claimed in claim 1, further comprising:
   a second resistor, having a first end and a second end, wherein the first end of the second resistor is coupled to the power voltage, and the second end of the second resistor is coupled to the first end of the first resistor and the anode of the second diode-connected transistor.

7. The power-on-reset circuit as claimed in claim 1, wherein the current comparator circuit comprises:
   a first transistor, having a first terminal, a second terminal and a control terminal, wherein the control terminal of the first transistor is coupled to a gate of the first diode-connected transistor, the first terminal of the first transistor is coupled to the reference voltage, and the second terminal of the first transistor is coupled to an output node of the current comparator circuit, wherein the output node provides the comparing result;
   a second transistor, having a first terminal, a second terminal and a control terminal, wherein the control terminal of the second transistor is coupled to a gate of the second diode-connected transistor, and the first terminal of the second transistor is coupled to the reference voltage; and
   a current mirror, having a master current terminal and a slave current terminal, wherein the master current terminal is coupled to the second terminal of the second transistor, and the slave current terminal is coupled to the output node.

8. The power-on-reset circuit as claimed in claim 7, wherein the current mirror comprises:
   a third transistor, having a first terminal, a second terminal and a control terminal, wherein the first terminal of the third transistor is coupled to the power voltage, the second terminal of the third transistor is coupled to the master current terminal of the current mirror, and the control terminal of the third transistor is coupled to the second terminal of the third transistor; and
   a fourth transistor, having a first terminal, a second terminal and a control terminal, wherein the first terminal of the fourth transistor is coupled to the power voltage, the second terminal of the fourth transistor is coupled to the slave current terminal of the current mirror, and the control terminal of the fourth transistor is coupled to the control terminal of the third transistor.

9. The power-on-reset circuit as claimed in claim 1, further comprising:
   an output stage circuit, coupled to the current comparator circuit for receiving the comparing result, and correspondingly generating the reset signal according to the comparing result.

10. The power-on-reset circuit as claimed in claim 9, wherein the output stage circuit comprises a Schmitt-trigger buffer, an input terminal of the Schmitt-trigger buffer is coupled to the current comparator circuit for receiving the comparing result, and an output terminal of the Schmitt-trigger buffer provides the reset signal.

11. The power-on-reset circuit as claimed in claim 9, wherein the output stage circuit comprises:
   a first transistor, having a first terminal, a second terminal and a control terminal, wherein the first terminal of the first transistor is coupled to the power voltage, and the control terminal of the first transistor is coupled to the current comparator circuit for receiving the comparing result;
   a second transistor, having a first terminal, a second terminal and a control terminal, wherein the first terminal of the second transistor is coupled to the second terminal of the first transistor, and the control terminal of the second transistor is coupled to the current comparator circuit for receiving the comparing result;
   a third transistor, having a first terminal, a second terminal and a control terminal, wherein the first terminal of the third transistor is coupled to a reference voltage, and the control terminal of the third transistor is coupled to the current comparator circuit for receiving the comparing result;
   a fourth transistor, having a first terminal, a second terminal and a control terminal, wherein the first terminal of the fourth transistor is coupled to the second terminal of the third transistor, the second terminal of the fourth transistor is coupled to the second terminal of the second transistor, and the control terminal of the fourth transistor is coupled to the current comparator circuit for receiving the comparing result;

a fifth transistor, having a first terminal, a second terminal and a control terminal, wherein the control terminal of the fifth transistor is coupled to the second terminal of the second transistor and the second terminal of the fourth transistor, the first terminal of the fifth transistor is coupled to the power voltage, and the second terminal of the fifth transistor is coupled to an output terminal of the output stage circuit for providing the reset signal; and a sixth transistor, having a first terminal, a second terminal and a control terminal, wherein the control terminal of the sixth transistor is coupled to the control terminal of the fifth transistor, a first terminal of the sixth transistor is coupled to the reference voltage, and the second terminal of the sixth transistor is coupled to the second terminal of the fifth transistor.

12. The power-on-reset circuit as claimed in claim 11, wherein the output stage circuit further comprises:

a seventh transistor, having a first terminal, a second terminal and a control terminal, wherein the first terminal of the seventh transistor is coupled to the second terminal of the first transistor, the second terminal of the seventh transistor is coupled to the reference voltage, and the control terminal of the seventh transistor is coupled to the second terminal of the second transistor; and an eighth transistor, having a first terminal, a second terminal and a control terminal, wherein the first terminal of the eighth transistor is coupled to the second terminal of the third transistor, the second terminal of the eighth transistor is coupled to the power voltage, and the control terminal of the eighth transistor is coupled to the second terminal of the fourth transistor.

* * * * *